(12) United States Patent
Chung et al.

(10) Patent No.: US 11,065,805 B2
(45) Date of Patent: Jul. 20, 2021

(54) WARPAGE REDUCTION DEVICE AND WARPAGE REDUCTION METHOD

(71) Applicant: EO TECHNICS CO., LTD., Anyang-si (KR)

(72) Inventors: Tai O. Chung, Uiwang-si (KR); Dae Ho Jung, Goyang-si (KR); In Su Kim, Seoul (KR); Gi Hong Seo, Gunpo-si (KR)

(73) Assignee: EO TECHNICS CO., LTD., Gyeonggi-Do (KR)

( * ) Notice: Subject to any disclaimer, the term of this patent is extended or adjusted under 35 U.S.C. 154(b) by 81 days.

(21) Appl. No.: 16/616,613

(22) PCT Filed: Apr. 9, 2018

(86) PCT No.: PCT/KR2018/004133
§ 371 (c)(1),
(2) Date: Nov. 25, 2019

(87) PCT Pub. No.: WO2018/221850
PCT Pub. Date: Dec. 6, 2018

(65) Prior Publication Data
US 2020/0171738 A1      Jun. 4, 2020

(30) Foreign Application Priority Data

May 29, 2017   (KR) .......................... 10-2017-0066386

(51) Int. Cl.
*H01L 21/67* (2006.01)
*B29C 51/10* (2006.01)
(Continued)

(52) U.S. Cl.
CPC .............. *B29C 51/10* (2013.01); *B29C 51/18* (2013.01); *B29C 51/421* (2013.01);
(Continued)

(58) Field of Classification Search
CPC ....... B29C 51/10; B29C 51/421; B29C 51/18; H01L 24/94; H01L 21/67092;
(Continued)

(56) References Cited

U.S. PATENT DOCUMENTS 6,617,539 B1   9/2003 Koinuma et al.
9,373,590 B1 * 6/2016 Interrante ............. H01L 23/562
(Continued)

FOREIGN PATENT DOCUMENTS

CN   103882381 A   6/2014
JP   2000087223 A  3/2000
(Continued)

OTHER PUBLICATIONS

International Search Report (with English Translation) and Written Opinion issued in corresponding International Patent Application No. PCT/KR2018/004133, 11 pages (Jul. 12, 2018).
(Continued)

*Primary Examiner* — Dung A. Le
(74) *Attorney, Agent, or Firm* — Buchanan Ingersoll & Rooney PC (57) ABSTRACT

A warpage reduction device the present disclosure includes a jig having a warped shape capable of distributing stress of a workpiece, a light source heating the workpiece so as to be flat, a pressurizer applying pressure to the heated workpiece to be pressed against the jig so as to be deformed, a cooler cooling the deformed workpiece, and a controller controlling operations of the light source, the pressurizer, and the cooler.

17 Claims, 6 Drawing Sheets

(51) Int. Cl.
  *B29C 51/18* (2006.01)
  *B29C 51/42* (2006.01)
  *H01L 21/56* (2006.01)
  *H01L 23/00* (2006.01)
  *B29L 31/34* (2006.01)

(52) U.S. Cl.
  CPC ...... *H01L 21/561* (2013.01); *H01L 21/67092* (2013.01); *H01L 21/67098* (2013.01); *H01L 21/67115* (2013.01); *H01L 24/94* (2013.01); *B29L 2031/3406* (2013.01)

(58) Field of Classification Search
  CPC ............ H01L 21/67115; H01L 21/561; H01L 21/67098; B29L 2031/3406
  See application file for complete search history.

(56) References Cited

U.S. PATENT DOCUMENTS

| | | | |
|---|---|---|---|
| 10,032,848 | B2 | 7/2018 | Tsuruoka et al. |
| 2012/0171875 | A1* | 7/2012 | Gan ................. H01L 21/67288 438/795 |
| 2013/0049381 | A1* | 2/2013 | Hageman ................. B61D 5/08 292/212 |
| 2013/0260535 | A1 | 10/2013 | Chen et al. |
| 2014/0178605 | A1 | 6/2014 | Kim et al. |
| 2015/0121964 | A1 | 5/2015 | Zhao et al. |
| 2016/0254209 | A1 | 9/2016 | Oohiraki et al. |

FOREIGN PATENT DOCUMENTS

| | | | |
|---|---|---|---|
| JP | 2007200993 | A | 8/2007 |
| JP | 2011127306 | A | 6/2011 |
| JP | 2015515436 | A | 5/2015 |
| KR | 20140081365 | A | 7/2014 |
| KR | 101545959 | B1 | 8/2015 |
| KR | 20160067172 | A | 6/2016 |
| KR | 101652812 | B1 | 9/2016 |
| TW | 201530709 | A | 8/2015 |

OTHER PUBLICATIONS

Notice of Allowance issued in corresponding Korean Application No. 10-2017-0066386, 3 pages (Dec. 11, 2018).

Office Action issued in corresponding Korean Application No. 10-2017-0066386, 6 pages (Jul. 19, 2018).

Office Action issued in corresponding Taiwanese Patent Application No. 107113768, 8 pages (Feb. 23, 2019).

* cited by examiner

WARPAGE REDUCTION DEVICE AND WARPAGE REDUCTION METHOD

TECHNICAL FIELD

The present disclosure relates to a warpage reduction device and a warpage reduction method, and more particularly, to an apparatus and method of reducing a degree of warpage of a semiconductor package after a post mold cure (PMC) process.

BACKGROUND ART

A method of packaging semiconductor chips cut from a wafer one by one has been used. Recently, with the development of a semiconductor packaging technology of processing the entire wafer at once, not only simplification of a process, but also a mounting space is decreased, which is referred to as wafer level packaging (WLP). In other words, the WLP, which is a technology to perform packaging in a wafer state in which semiconductor chips are not cut, has remarkably improved an assembly process in semiconductors. With the recent development of ultrathin portable devices and the device market, manufacturing of multifunctional, ultra compact, and ultrathin semiconductor chips is demanded. To cope with the demand, in the current semiconductor market, chip scale package (CSP), through silicon via (TSV), package on package (POP), fan-out wafer level package (FOWLP), etc. are being researched.

On the other hand, in semiconductor packaging, the entire substrate, on which a plurality of semiconductor chips are attached, is molded with an encapsulant such as an epoxy molding compound (EMC) and the encapsulant such as the EMC is cured, during a molding process of semiconductor packaging to protect the semiconductor chips from external stress. The EMC is manufactured as EMC pellets before curing and liquefied at about 175° C. for loading and hardened about 70 seconds to cure about 90% of the EMC. Thereafter, the EMC is baked in a convection oven for about several hours, thereby completing curing. As the curing process is performed at high temperature over 100° C., in a process of lowering the temperature to room temperature after fixing is completed, a workpiece is warped due to a difference between an EMC's shrinkage and a coefficient of thermal expansion of a substance. When excessive warpage occurs in the workpiece, a problem that handling the workpiece would be difficult may be generated in an automation process or an unmanned process.

DESCRIPTION OF EMBODIMENTS

Technical Problem

The present disclosure relates to a warpage reduction device and a warpage reduction method, and more particularly, to an apparatus and method of reducing a degree of warpage of a semiconductor package after a post mold cure process.

Solution to Problem

A warpage reduction device according to an embodiment includes
  a jig, on which a workpiece is placed, having a warped shape capable of distributing stress of the workpiece,
  a light source configured to heat the workpiece,
  a pressurizer configured to apply pressure to press the heated workpiece against the jig so as to be deformed,
  a cooler configured to cool the deformed workpiece,
  and a controller configured to control operations of the light source, the pressurizer, and the cooler.

The jig may have a warped shape to have at least one limit point with respect to a sectional portion of the jig.

The jig may have a warped shape to have at least two inflection points with respect to a sectional portion of the jig.

The jig may have a degree of warpage of about 5 mm or less.

The warpage reduction device may further include a warpage measurement vision configured to measure a degree of warpage of the workpiece.

The workpiece may include any one of a panel having a polygonal shape, a wafer having a circular shape, and a substrate.

The warpage reduction device may further include a temperature measurement portion configured to measure a temperature of the workpiece.

The pressurizer may include
  a chuck provided under the jig and
  an adsorber configured to suck a fluid from the chuck and apply pressure to press the workpiece against the jig.

The light source may include at least one of a laser diode, an LED light source, an IR light source, or a halogen light source.

The warpage reduction device may further include a beam expander configured to extend a diameter of light from the light source.

The cooler may include
  a cooling fluid storing portion configured to store a cooling fluid and
  a nozzle portion configured to spray the cooling fluid to the deformed workpiece.

The warpage reduction device may further include a clamp configured to fix the workpiece against the jig.

A warpage reduction method according to an embodiment includes
  placing a warped workpiece on a jig,
  heating the workpiece to a deformation temperature,
  applying pressure to the workpiece so as to press the workpiece against the jig, and
  cooling and curing the workpiece having a deformed shape by being pressed against the jig.

The jig may have a warped shape capable of distributing stress of the workpiece.

The jig may have a warped shape to have at least one limit point with respect to a sectional portion of the jig.

The jig may have a warped shape to have at least two inflection points with respect to a sectional portion of the jig.

The warpage reduction method may further include, after placing the workpiece on the jig, fixing the workpiece to the jig by using a clamp.

In the heating of the workpiece to a deformation temperature, the workpiece may be heated by irradiating a laser beam onto the workpiece.

The warpage reduction method may further include, after the heating of the workpiece to a deformation temperature, controlling an irradiation range and output of a laser beam by measuring a temperature of the workpiece.

Advantageous Effects of Disclosure

According to the present disclosure, deformation of an excessively warped workpiece due to a difference between an EMC's shrinkage and a coefficient of thermal expansion of a substance may be reduced.

According to the present disclosure, as a workpiece that is warped not to be used for an automation process is heated, pressed against a jig so as to be deformed, and cooled, a degree of warpage may be reduced such that a shape of the workpiece may be used for the automation process.

According to the present disclosure, as a jig has a shape capable of distributing stress and a workpiece is pressed against the jig so as to be deformed, stress in a warped portion of the jig is distributed so that a degree of warpage may be reduced.

MODE OF DISCLOSURE

The effect and features of the present embodiments, and a method to achieve the same, will be clearer referring to the detailed descriptions below with the drawings. However, the present embodiments may be implemented in various forms, not by being limited to the embodiments presented below, and it is to be appreciated that all changes, equivalents, and substitutes that do not depart from the spirit and technical scope of the present disclosure are encompassed in the present disclosure. The embodiments disclosed below complete the present disclosure and to completely inform a skilled person in the art to which the present disclosure belongs to of the scope of the present disclosure. When detailed descriptions about related well-known functions or structures are determined to make the gist of the present disclosure unclear, the detailed descriptions will be omitted herein.

Terms used in the present specification are used for explaining a specific embodiment, not for limiting the present disclosure. Thus, an expression used in a singular form in the present specification also includes the expression in its plural form unless clearly specified otherwise in context. Also, in the present disclosure, terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof. Terms such as "first" and "second" are used herein merely to describe a variety of constituent elements, but the constituent elements are not limited by the terms. Such terms are used only for the purpose of distinguishing one constituent element from another constituent element.

The present disclosure will now be described more fully with reference to the accompanying drawings, in which embodiments of the disclosure are shown. Throughout the drawings, like reference numerals denote like elements, and redundant explanations are omitted.

Figure 1A:
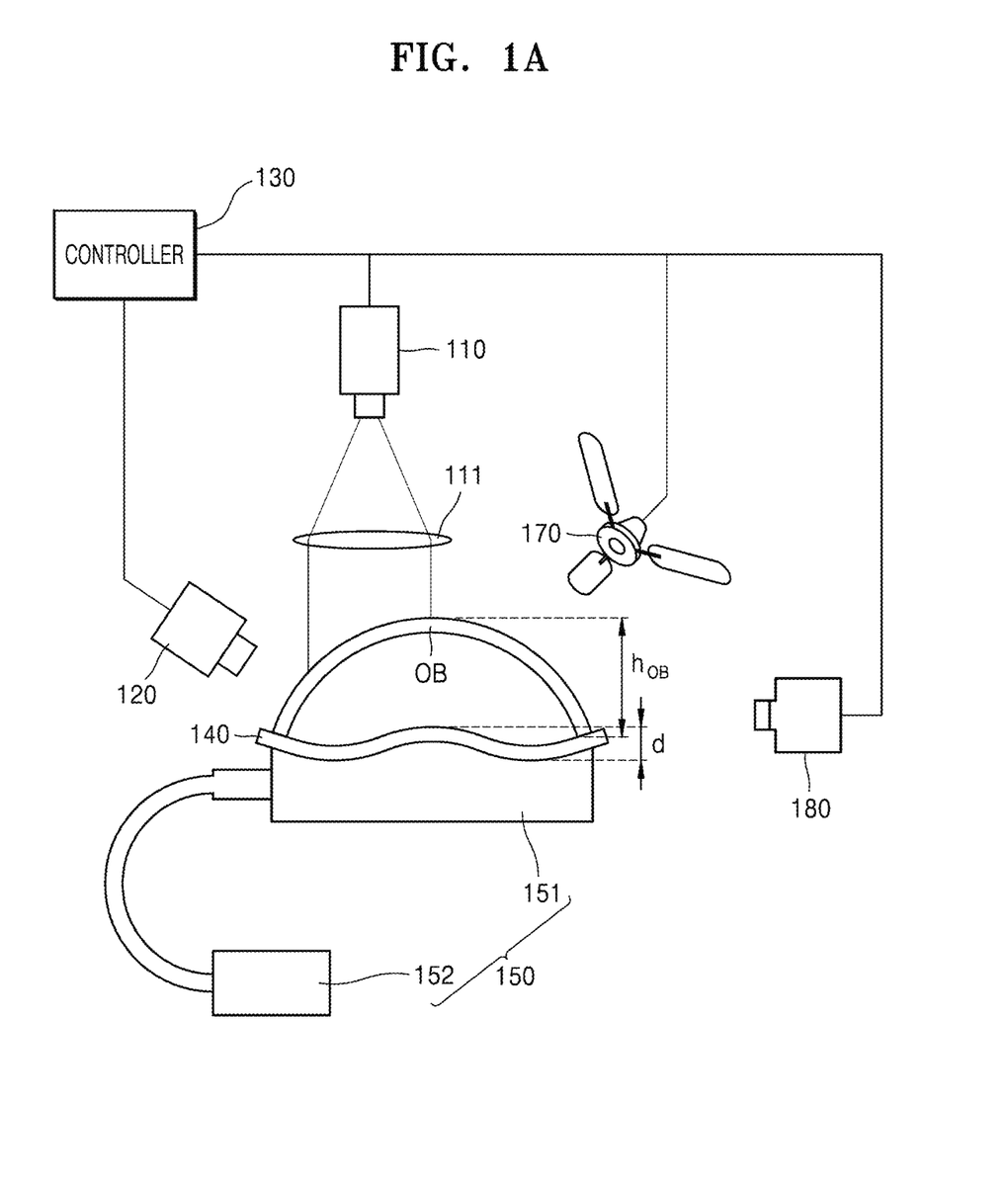
FIGS. 1A and 1B schematically illustrate a warpage reduction device according to an embodiment.
Figure 1B:
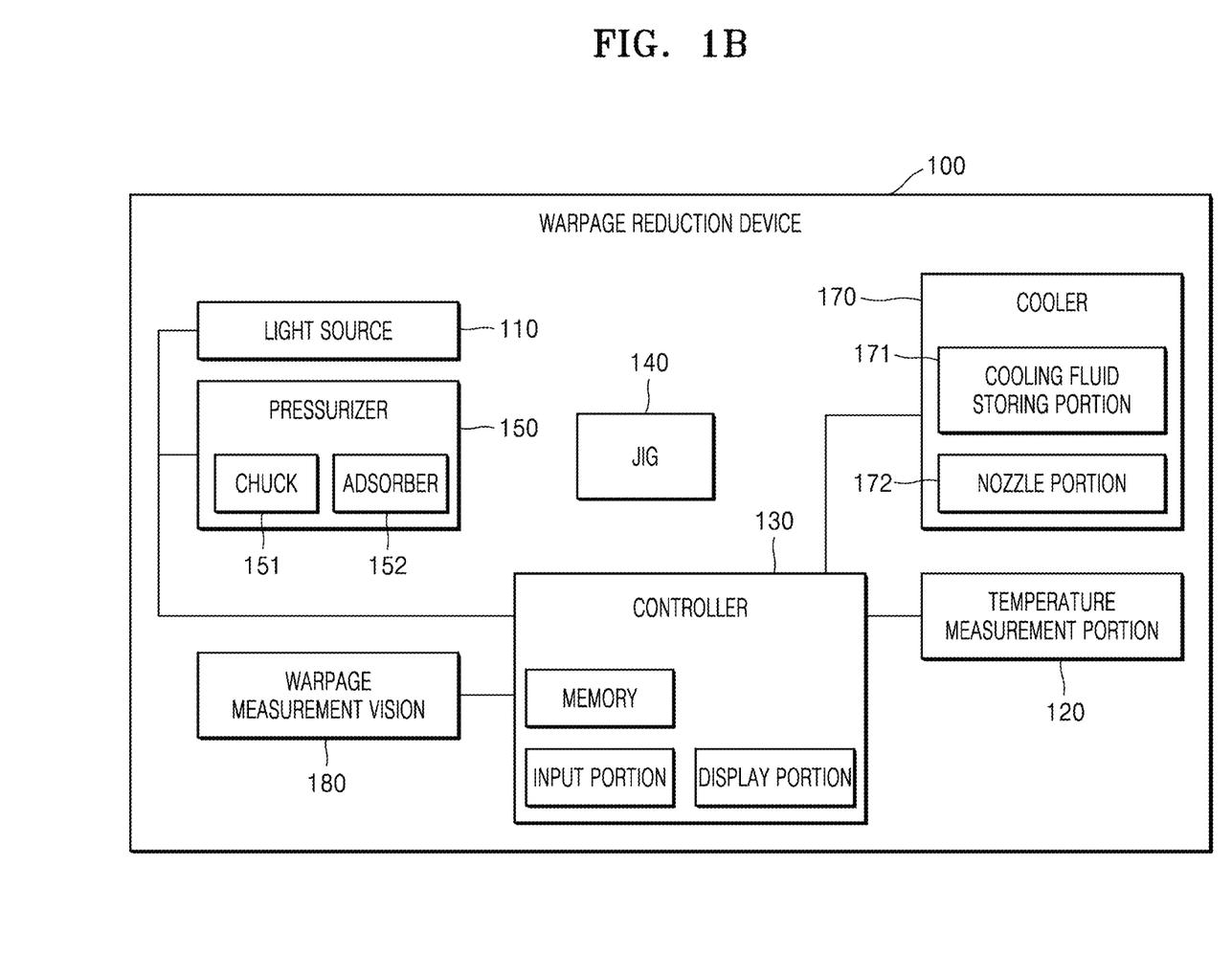

FIGS. 1A and 1B schematically illustrate a warpage reduction device 100 according to an embodiment.

Referring to FIGS. 1A and 1B, the warpage reduction device 100 may include a light source 110, a temperature measurement portion 120, a controller 130, a jig 140, a chuck 151, an adsorber 152, a cooler 170, and a warpage measurement vision 180.

The light source 110 is an optical device capable of heating a workpiece OB. For example, the light source 110 may be a laser diode for emitting a laser beam. For example, the light source 110 may be at least one of an LED light source, an IR light source, or a halogen light source. The light source 110 may facilitate deformation of the workpiece OB by heating the workpiece. For example, the light source 110 may apply heat to the workpiece OB to a deformation temperature of the workpiece OB or more.

A beam expander 111 may be provided in front of the light source 110 to extend the diameter of light emitted from the light source 110. A large area of the workpiece OB may be easily heated by the beam expander 111. The workpiece OB may be uniformly heated by the beam expander 111.

The temperature measurement portion 120 is a temperature measurement device capable of measuring the temperature of the workpiece OB. For example, the temperature measurement portion 120 may check whether the workpiece OB, when heated, reaches the deformation temperature. The temperature measurement portion 120 may be implemented in a non-contact method such as a radiation temperature measurement portion or a pyrometer, but the present disclosure is not limited thereto.

The workpiece OB is an object that is subject to reduction of a degree of warpage. The workpiece OB may include, for example, a semiconductor chip and a molding member for molding the semiconductor chip. The molding member may be an encapsulant such as an epoxy molding compound (EMC) or a polymer. When the molding member includes an EMC, the EMC may have a coefficient of thermal expansion (CTE) of about 20-30 ppm/° C., the semiconductor chip may have a CTE of about 2-3 ppm/° C., and a substrate supporting the semiconductor chip may have a CTE of about 18-20 ppm/° C. Accordingly, when the temperature changes according to a curing process of the molding member, the entire workpiece OB may be excessively warped due to different physical properties thereof. For example, a degree of warpage $h_{OB}$ of the workpiece OB may be defined by a difference between the minimum point and the maximum point with respect to a sectional portion thereof. A degree of warpage $h_{OB}$ of the workpiece OB that is excessively warped may be, for example, 20 mm or more. When a degree of warpage $h_{OB}$ of the workpiece OB is excessive, it is impossible to handle the workpiece OB through an automation process or an unmanned process so that the process speed may be much reduced. In the present specification, an excessive degree of warpage is defined to be a degree of warpage $h_{OB}$ at which handling through an automation process or an unmanned process is impossible.

The jig 140 is a device to place the workpiece OB that is warped. The jig 140 may have a warped shape capable of distributing stress of the workpiece OB. Accordingly, the jig 140 according to the present embodiment may press the workpiece OB that is excessively warped, against the jig 140, so as to be deformed, thereby reducing a degree of warpage of the workpiece OB. For example, as the workpiece OB having a degree of warpage $h_{OB}$ of about 20 mm or more is pressed against the jig 140 having a shape capable of distributing stress so as to be deformed, a degree of warpage $h_{OB}$ of the workpiece OB may be reduced to about 6 mm or less. A degree d of warpage of the jig 140 may be about 6 mm or less. As the workpiece OB having a reduced degree of warpage is handled through an automation process or an unmanned process, the workpiece OB that has been disposed of may be processed so that costs may be saved and a process speed may be improved.

As described above, the shape of the jig 140 may have a warped shape capable of distributing stress. The jig 140 may have a shape obtained by bending or warping a basic shape including a polygonal flat plate or a circular flat plate. For example, the jig 140 may have a variety of embodiments according to a degree and shape of warpage of the basic shape, but the present disclosure is not limited to a specific embodiment. For example, the jig 140 may be a warped flat plate having at least one limit point with respect to a sectional portion thereof. For example, the jig 140 may have a shape having one valley with respect to the sectional portion thereof or a shape having one ridge with respect to the sectional portion thereof. For example, the jig 140 may have a shape having at least two inflection points with respect to the sectional portion thereof. Each embodiment is described in detail with reference to FIGS. 2 to 5B.

As the shapes of the workpiece OB and the jig 140 are different from each other, a fixing portion (not shown) for fixing the workpiece OB to the jig 140 may be further provided. The fixing portion may include, for example, a clamp.

A pressurizer 150 may include the chuck 151 provided under the jig 140 and the adsorber 152. The chuck 151 may apply a downward pressure to the workpiece OB such that the workpiece OB placed on the jig 140 is deformed to fit to the shape of the jig 140. The chuck 151 may include, for example, a vacuum plate including a plurality of holes. The adsorber 152 may be operated, by sucking a liquid from the chuck 151 at a high pressure, such that the chuck 151 may apply a downward pressure to the workpiece OB. For example, the adsorber 152 may include a dust collector or a vacuum pump.

The cooler 170 may be a device to rapidly cool the workpiece OB to room temperature. For example, the cooler 170 may include a cooling fluid storing portion 171 for storing a cooling fluid and a nozzle portion 172 for spraying the cooling fluid. The cooling fluid stored in the cooling fluid storing portion 171 may be cooling air and may have a cooling capacity of about 100 Kcal/hr to 200 Kcal/hr, thereby cooling the workpiece OB to room temperature within about 5 to 10 seconds. However, the present disclosure is not limited thereto, and a spray amount of the cooling fluid may be adjusted by the controller 130 that is described below, according to a cooling speed of the workpiece OB.

The warpage measurement vision 180 is a measurement device for checking a degree of warpage of the workpiece OB. For example, the warpage measurement vision 180 may check a degree of warpage $h_{OB}$ of the workpiece OB that is warped and check a degree of warpage $h_{OB}$ of the workpiece OB after a warpage reduction process is performed. The warpage measurement vision 180 may use visible light or infrared light, but the present disclosure is not limited thereto.

The controller 130 may include hardware and software to control the operations of the light source 110, the temperature measurement portion 120, the pressurizer 150, the cooler 170, and the warpage measurement vision 180. The controller 130 may generate control signals for the light source 110, the temperature measurement portion 120, the pressurizer 150, the warpage measurement vision 180, and the cooler 170 from an input signal input from an input portion and a program stored in a memory. In an example, the controller 130 may control the intensity and irradiation area of a laser beam emitted from the light source 110 in response to an input signal input from the input portion, a flow rate of the cooling fluid sprayed by the cooler 170, and a pressure by the pressurizer 150 to be applied to the workpiece OB. In this state, the controller 130 may be implemented as a single microprocessor module, or a combination of two or more microprocessor modules. In other words, the implementation form of the controller 130 is not limited to any of the above forms.

The controller 130 may include the input portion and a display portion. The input portion may include a button, a keypad, a dial, or a touch interface for manipulating the warpage reduction device 100. The display portion may be implemented by a display panel to display information related to the warpage reduction device 100, for example, information about temperature of a workpiece, intensity of a light source, irradiation area, or pressure of a pressurizer. In an example, the display portion may include an LCD panel or an OLED panel and display analyzed information in an image or text.

Figure 2:
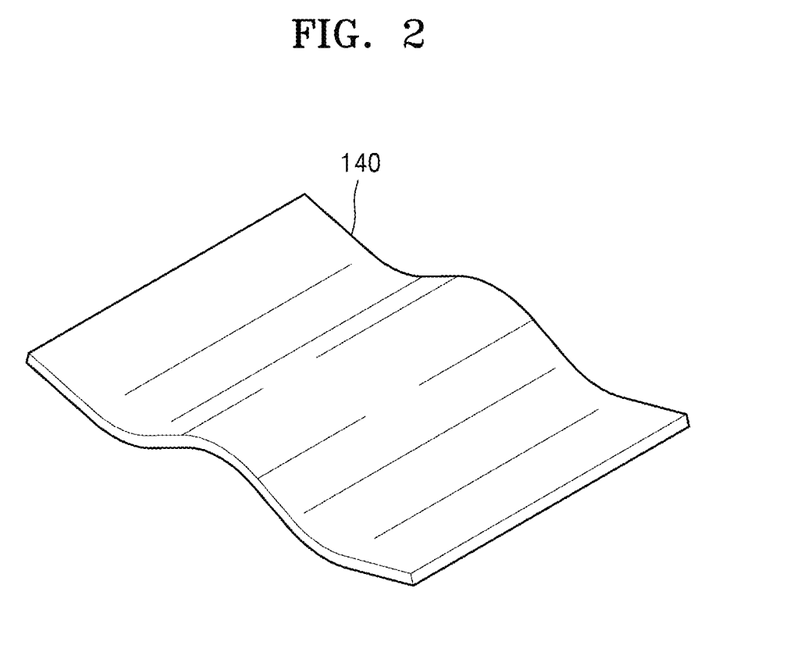
FIG. 2 is a schematic perspective view of the shape of a jig according to an embodiment.

FIG. 2 is a schematic perspective view of the shape of the jig 140 according to an embodiment. Referring to FIG. 2, the jig 140 may have a shape of a warped rectangular flat plate. The jig 140 may correspond to a workpiece having a rectangular shape. For example, the workpiece corresponding to the jig 140 may include a panel.

The jig 140 may have a shape having a ridge at a center thereof with respect to the sectional portion thereof. The jig 140 may have at least two inflection points. For example, referring to FIG. 2, the jig 140 may have a shape warped in a wave form having one maximum point and two minimum points. However, the jig 140 is not limited to the illustrated shape and may have a variously warped flat panel shape having at least two inflection points.

The jig 140 may have a degree d of warpage of about 6 mm or less with respect to the sectional portion thereof, in which the degree d of warpage is a difference between the maximum point and the minimum point. For example, the degree d of warpage of the jig 140 may be 5 mm or less. When a workpiece (not shown) is pressed against the jig 140 according to the present embodiment, a degree of warpage $h_{OB}$ of the workpiece may be reduced to about 6 mm or less. The workpiece (not shown) may be used for an automation process or an unmanned process.

Figure 3:
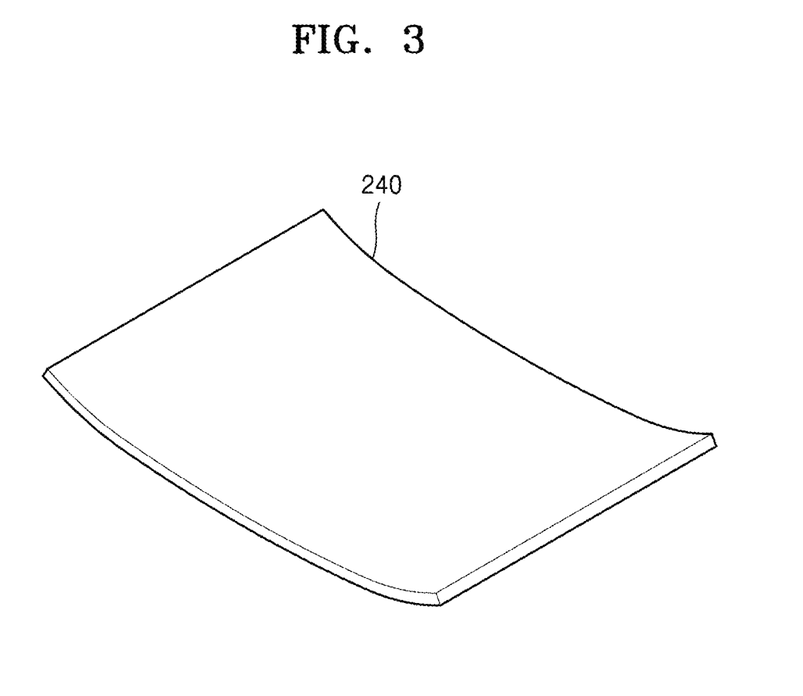
FIG. 3 is a schematic perspective view of the shape of a jig according to another embodiment.

FIG. 3 is a schematic perspective view of the shape of a jig 240 according to another embodiment.

Referring to FIG. 3, the jig 240 may have a shape of a warped rectangular flat panel. The jig 240 may correspond to a workpiece having a rectangular shape. For example, the workpiece corresponding to the jig 240 may include a panel.

The jig 240 may have a shape having a valley at a center portion thereof, with respect to a sectional portion thereof. The jig 240 may have a curved flat panel shape having no inflection point. For example, referring to FIG. 3, the jig 240 may one minimum point at the center portion thereof. However, the jig 240 is not limited to the illustrated shape and may have a variously warped flat panel shape having one limit point.

The jig 240 may have a degree d of warpage of about 6 mm or less with respect to the sectional portion thereof, in which the degree d of warpage is a difference between the maximum point and the minimum point. For example, the degree d of warpage of the jig 240 may be about 5 mm or less. When a workpiece (not shown) is pressed against the jig 240 according to the present embodiment, a degree of warpage $h_{OB}$ of the workpiece may be reduced to about 6 mm or less. The workpiece (not shown) may be used for an automation process or an unmanned process.

Figure 4A:
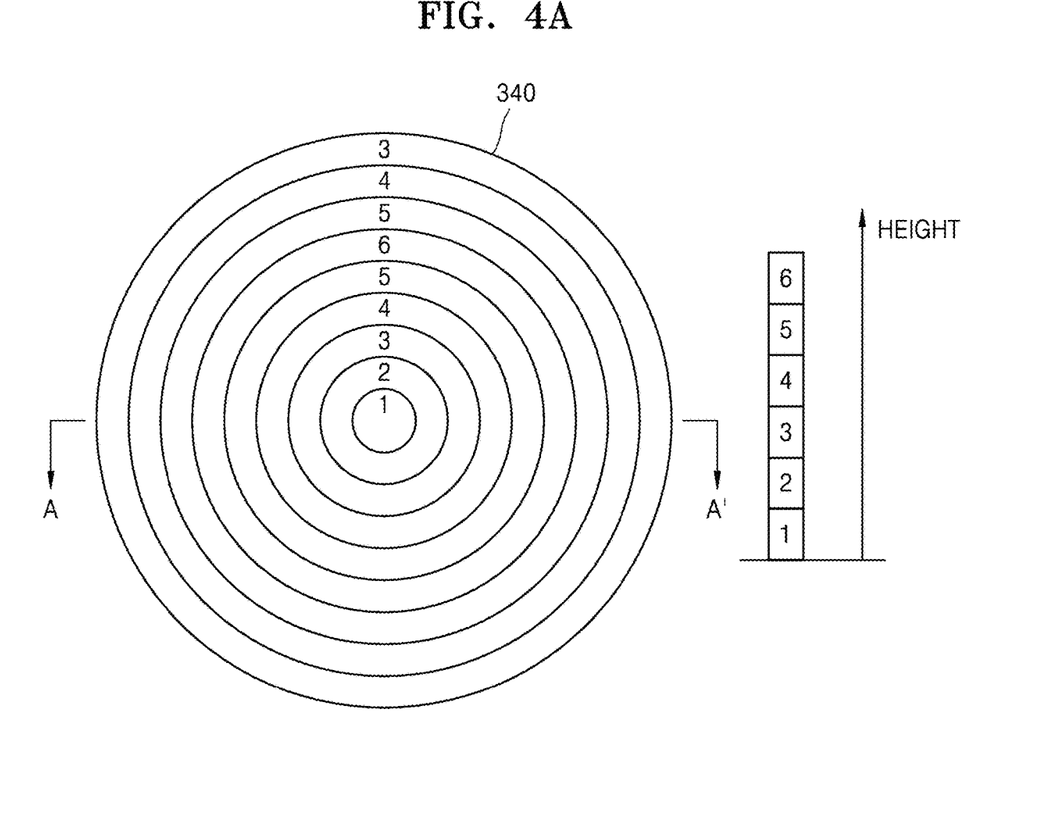
FIGS. 4A and 4B schematically illustrate the shape of a jig according to another embodiment.
Figure 4B:
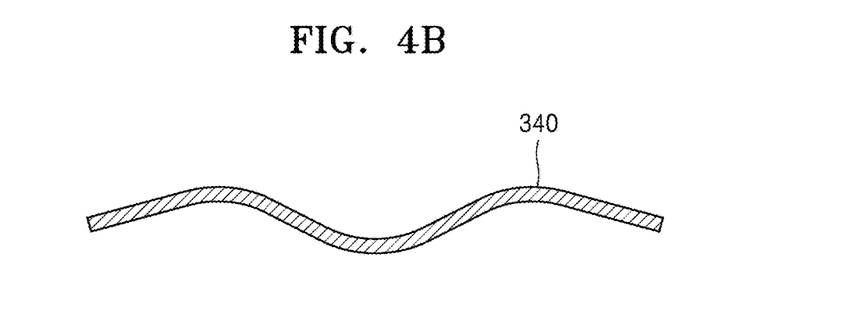

FIGS. 4A and 4B schematically illustrate the shape of a jig 340 according to another embodiment. FIG. 4A is a plan view of the jig 340, and FIG. 4B is a cross-sectional view of the jig 340 taken along like A-A'.

Referring to FIGS. 4A and 4B, the jig 340 may have a shape of a warped circular flat panel. The jig 340 may correspond to a workpiece having a circular shape. For example, the workpiece corresponding to the jig 340 may include a wafer.

The jig 340 may have a concentric structure around a center point with respect to a flat surface portion thereof. Each concentric circle may have the same height. A center portion of the jig 340 may be a valley. The jig 340 may have a warped circular disc shape having at least two inflection points, with respect to a sectional portion thereof. For example, referring to FIG. 4B, the jig 340 may have one minimum point at the center portion thereof. For example, the jig 340 may have two maximum points. However, the jig 340 is not limited to the illustrated shape, and may have a variously warped circular disc shape having at least two inflection points. Referring to FIG. 4A, when a height is defined from the minimum point of the jig 340, the jig 340 may have a shape that is warped such that the height gradually increases and then decreases from the center portion thereof toward the outside.

The jig 340 may have a degree d of warpage of about 6 mm or less with respect to a sectional portion thereof, in which the degree d of warpage is a difference between the maximum point and the minimum point. For example, the degree d of warpage of the jig 340 may be 5 mm or less. When a workpiece (not shown) is pressed against the jig 340 according to the present embodiment, a degree of warpage $h_{OB}$ of the workpiece may be reduced to about 6 mm or less. The workpiece (not shown) may be used for an automation process or an unmanned process.

Figure 5A:
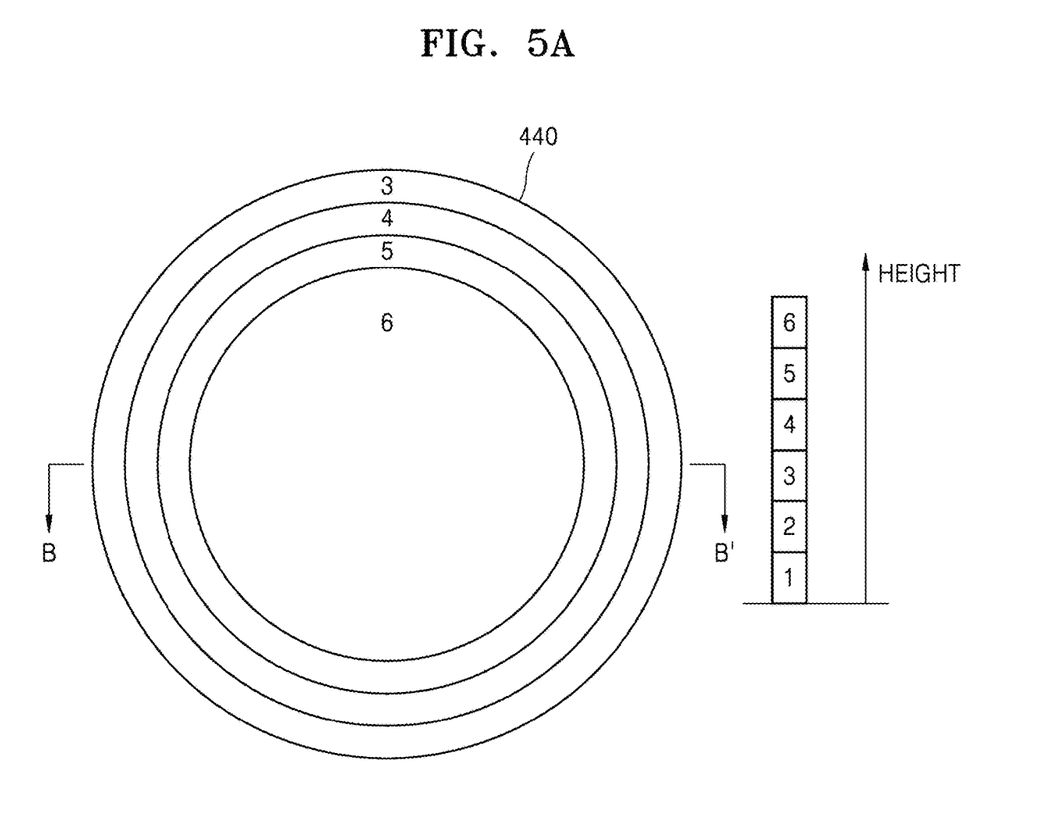
FIGS. 5A and 5B schematically illustrate the shape of a jig according to another embodiment.
Figure 5B:
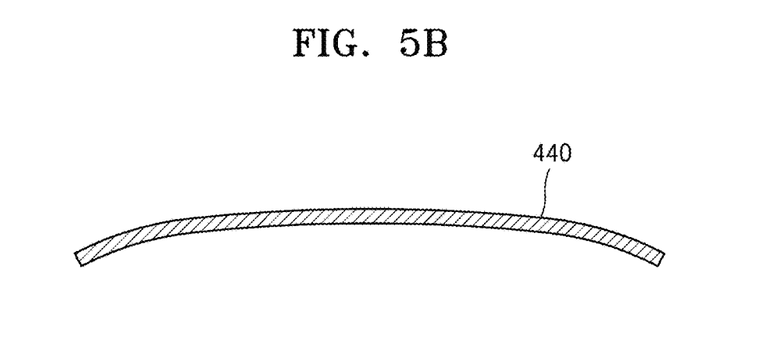

FIGS. 5A and 5B schematically illustrate the shape of a jig 440 according to another embodiment. FIG. 5A is a plan view of the jig 440, and FIG. 5B is a cross-sectional view of the jig 440 taken along line B-B'.

Referring to FIGS. 5A and 5B, the jig 440 may have a shape of a warped circular flat panel. The jig 440 may correspond to a workpiece having a circular shape. For example, the workpiece corresponding to the jig 440 may include a wafer.

The jig 440 may have a concentric structure around a center point with respect to a flat surface portion thereof. Each concentric circle may have the same height. A center portion of the jig 440 may be a ridge. The jig 440 may have a warped circular disc shape having no inflection point, with respect to a sectional portion thereof. For example, referring to FIG. 5B, the jig 440 may have one limit point at the center portion thereof. However, the jig 440 is not limited to the illustrated shape, and may have a variously warped circular disc shape having one limit point. Referring to FIG. 5A, when a height is defined from the minimum point of the jig 440, the jig 440 may have a shape that is warped such that the height gradually decreases from the center portion thereof toward the outside.

The jig 440 may have a degree d of warpage of about 6 mm or less with respect to a sectional portion thereof, in which the degree d of warpage is a difference between the maximum point and the minimum point. For example, the degree d of warpage of the jig 440 may be 5 mm or less. When a workpiece (not shown) is pressed against the jig 440 according to the present embodiment, a degree of warpage $h_{OB}$ of the workpiece may be reduced to about 6 mm or less. The workpiece (not shown) may be used for an automation process or an unmanned process.

Figure 6:
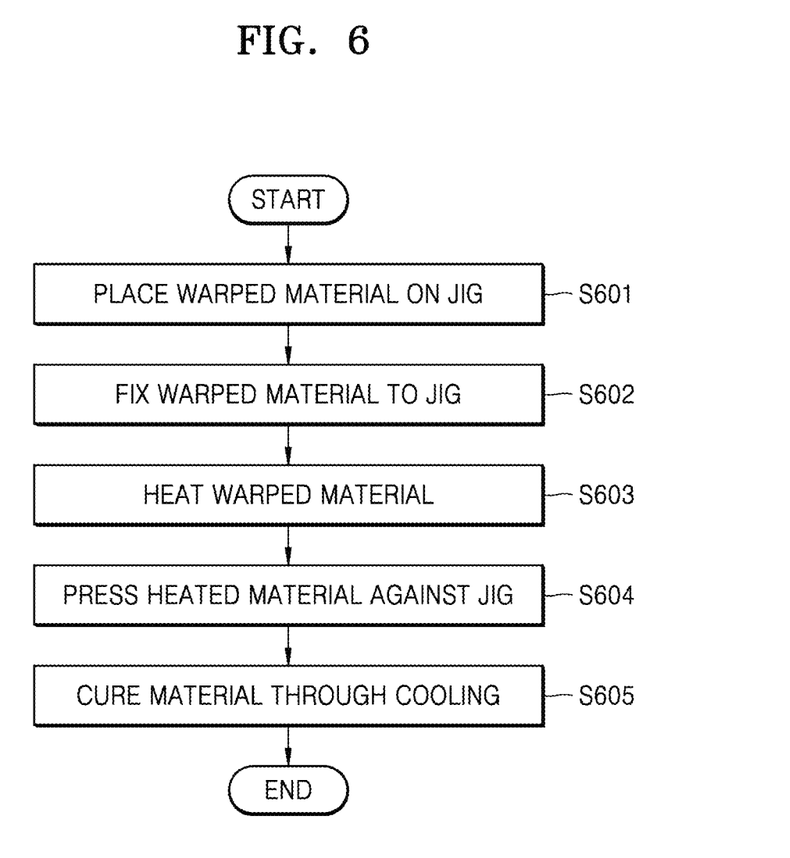
FIG. 6 is a flowchart of a warpage reduction method according to an embodiment.

FIG. 6 is a flowchart of a warpage reduction method according to an embodiment.

First, a warped workpiece is placed on a jig (S601). A workpiece may include a substrate, a semiconductor chip, and a molding member. As CTEs of a semiconductor chip, a molding member, and a substrate forming a workpiece are different from one another, when a temperature changes according to a curing process, the entire workpiece may be excessively warped due to different physical properties. The excessive warping may be defined to be warped so as not to be handled in an automation process, for example, a degree of warpage exceeds about 20 mm. A substrate included in a warped workpiece may include a panel or a wafer.

Next, the warped workpiece is fixed to the jig (S602). As the shapes of the warped workpiece and the jig are different from each other, a fixing portion such as a clamp may be used to fix the warped workpiece to the jig.

Next, the warped workpiece may be heated (S603). The warped workpiece may be heated to a deformation temperature to deform the shape of the warped workpiece that is already cured. The warped workpiece may be heated by a light source. For example, the light source may include a laser diode for irradiating a laser beam. For example, the light source may include an IR light source, an LED light source, or a halogen light source, which irradiate a beam. To check whether the warped workpiece is heated to the deformation temperature, the temperature of the warped workpiece may be checked by using a temperature measurement portion. After the present operation, an operation of checking the temperature of the warped workpiece and controlling an irradiation range and output of a laser beam emitted from the laser diode may be further included.

Next, the heated workpiece is pressed against the jig (S604). In the present operation, the workpiece heated to the deformation temperature is pressed against the jig so that the workpiece may be deformed to have the shape of the jig. A chuck provided under the jig may be, for example, a vacuum plate having a plurality of holes, and an adsorber may suck a fluid from the chuck so as to press the heated workpiece against the jig. The adsorber may be a dust collector or a vacuum pump.

Next, the workpiece is cooled and cured (S605). The workpiece pressed against the jig may be cured through rapid cooling by a cooler. Accordingly, the jig is deformed to have a shape capable of distributing stress, thereby reducing warpage. In an example, a cooling fluid having a certain cooling fluid amount may be discharged from a cooling fluid storing portion through a nozzle portion. In this state, the cooling fluid may be cooling air having a cooling capacity of about 100 Kcal/hr to 200 Kcal/hr, but the present disclosure is not limited thereto Accordingly, as the cooling and curing of the workpiece is carried out, the workpiece may have a shape of the jig having reduced warpage. Accordingly, the warpage reduction method may be completed.

The above descriptions of the present disclosure is for an example, and it will be understood that one of ordinary skill in the art to which the present disclosure pertains can easily modify the present disclosure into other detailed form without changing the technical concept or essential features of the present disclosure. Thus, the above-described embodiments are exemplary in all aspects and should not be for purposes of limitation. For example, each constituent element described to be a single type may be embodied in a distributive manner. Likewise, the constituent elements described to be distributed may be embodied in a combined form.

The scope of the present disclosure is defined not by the detailed description of the disclosure but by the appended claims, and all changes and modifications introduced from the concept and scope of the claims and the equivalent concept thereof will be construed as being included in the present disclosure.

The invention claimed is:

1. A warpage reduction device comprising:
a jig, on which a workpiece is placed, having a warped shape capable of distributing stress of the workpiece;
a light source configured to heat the workpiece;
a pressurizer configured to apply pressure to press the heated workpiece against the jig so as to be deformed;
a cooler configured to cool the deformed workpiece;
a controller configured to control operations of the light source, the pressurizer, and the cooler; and
a warpage measurement vision configured to measure a degree of warpage of the workpiece.

2. The warpage reduction device of claim 1, wherein the jig has a warped shape to have at least one limit point with respect to a sectional portion of the jig.

3. The warpage reduction device of claim 1, wherein the jig has a warped shape to have at least two inflection points with respect to a sectional portion of the jig.

4. The warpage reduction device of claim 1, wherein the workpiece includes any one of a panel having a polygonal shape, a wafer having a circular shape, and a substrate.

5. The warpage reduction device of claim 1, further comprising
a temperature measurement portion configured to measure a temperature of the workpiece.

6. The warpage reduction device of claim 1, wherein the pressurizer comprises:
a chuck provided under the jig; and
an adsorber configured to suck a fluid from the chuck and apply pressure to press the workpiece against the jig.

7. The warpage reduction device of claim 1, wherein the light source comprises at least one of a laser diode, an LED light source, an IR light source, or a halogen light source.

8. The warpage reduction device of claim 1, further comprising
a beam expander configured to extend a diameter of light from the light source.

9. The warpage reduction device of claim 1, wherein the cooler comprises:
a cooling fluid storing portion configured to store a cooling fluid; and
a nozzle portion configured to spray the cooling fluid to the deformed workpiece.

10. The warpage reduction device of claim 1, further comprising
a fixing portion configured to fix the workpiece against the jig.

11. A warpage reduction method comprising:
placing a workpiece on a jig, the jig having a shape capable of distributing stress of the workpiece;
heating the workpiece to a deformation temperature;
applying pressure to the workpiece so as to press the workpiece against the jig; and
cooling and curing the workpiece having a deformed shape by being pressed against the jig;
configuring a warpage measurement vision to measure a degree of warpage of the workpiece.

12. The warpage reduction method of claim 11, wherein the jig has a warped shape to have at least one limit point with respect to a sectional portion of the jig.

13. The warpage reduction method of claim 11, wherein the jig has a warped shape to have at least two inflection points with respect to a sectional portion of the jig.

14. The warpage reduction method of claim 11, further comprising,
after placing the workpiece on the jig, fixing the workpiece to the jig.

15. The warpage reduction method of claim 11, wherein, in the heating of the workpiece to a deformation temperature, the workpiece is heated by irradiating a laser beam onto the workpiece.

16. The warpage reduction method of claim 15, further comprising,
after the heating of the workpiece to a deformation temperature, controlling an irradiation range and output of a laser beam by measuring a temperature of the workpiece.

17. The warpage reduction method of claim 11, wherein the workpiece is a flat panel or a warped workpiece.

* * * * *